United States Patent [19]

Matsui

[11] Patent Number: 4,956,553
[45] Date of Patent: Sep. 11, 1990

[54] OPTICAL ENCODER WITH VARYING GRATING PITCH

[75] Inventor: Keiji Matsui, Aichi, Japan

[73] Assignee: Kabushiki Kaisha Okuma Tekkosho, Aichi, Japan

[21] Appl. No.: 374,922

[22] Filed: Jul. 3, 1989

Related U.S. Application Data

[62] Division of Ser. No. 251,089, Sep. 29, 1988.

[30] Foreign Application Priority Data

Sep. 30, 1987 [JP] Japan ................... 62-246726
Sep. 30, 1987 [JP] Japan ................... 62-246727
Oct. 27, 1987 [JP] Japan ................... 62-271530

[51] Int. Cl.$^5$ ............................ H01J 3/14; G01D 5/34
[52] U.S. Cl. ............................ 250/237 G; 250/231.18
[58] Field of Search ............... 250/237 G, 231 SE;
356/373, 374, 375; 341/13; 33/706, 707

[56] References Cited

U.S. PATENT DOCUMENTS

| | | | |
|---|---|---|---|
| 3,166,624 | 1/1965 | Vargady | 250/237 G |
| 3,985,448 | 10/1976 | Wiklund et al. | 250/237 G |
| 4,011,435 | 3/1977 | Phelps et al. | 250/237 G |
| 4,443,108 | 4/1984 | Webster | 250/231 SE |
| 4,528,448 | 7/1985 | Doggett | 250/550 |
| 4,631,416 | 12/1986 | Trutna, Jr. | 250/237 G |
| 4,778,273 | 10/1988 | Michel | 250/237 G |
| 4,823,001 | 4/1989 | Kobayashi et al. | 250/237 G |

Primary Examiner—David C. Nelms
Assistant Examiner—Michael Messinger
Attorney, Agent, or Firm—Wenderoth, Lind & Ponack

[57] ABSTRACT

An optical encoder includes a light source for emitting coherent parallel light and a scale having a grating track for defracting parallel light emitted from the light source. The grating track of the scale includes a plurality of linear adjacent gratings extending in a lengthwise direction. Each of the gratings extends in a widthwise direction direction to define a pitch of the grating. Each grating includes a non-transmitting portion and an adjacent transmitting portion extending in lengthwise direction. The aperture ratio defined by the ratio between a width of the transmitting portion and the pitch of each grating is substantially constant for each of the gratings along the grating track. However, the pitch of each of the gratings of the grating track varies along the grating track. A light spot positioning detector is provided for receiving positive and negative defracted light beams of a same order defracted from a grating track for determining a position of the scale.

15 Claims, 18 Drawing Sheets

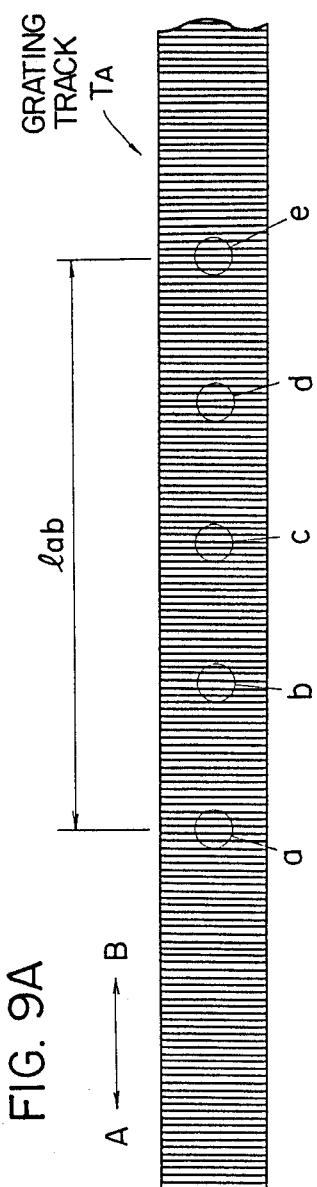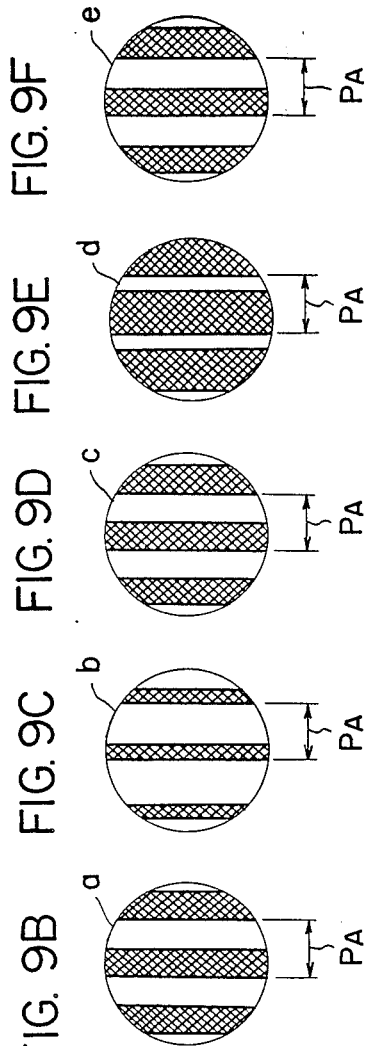

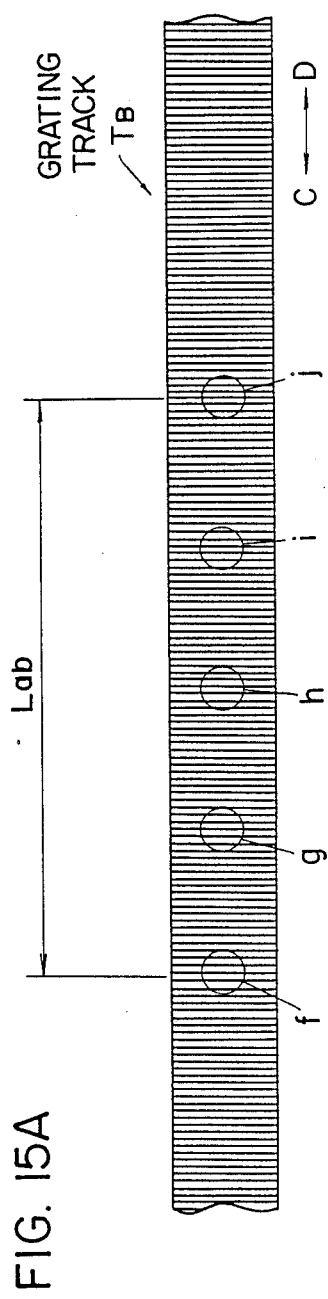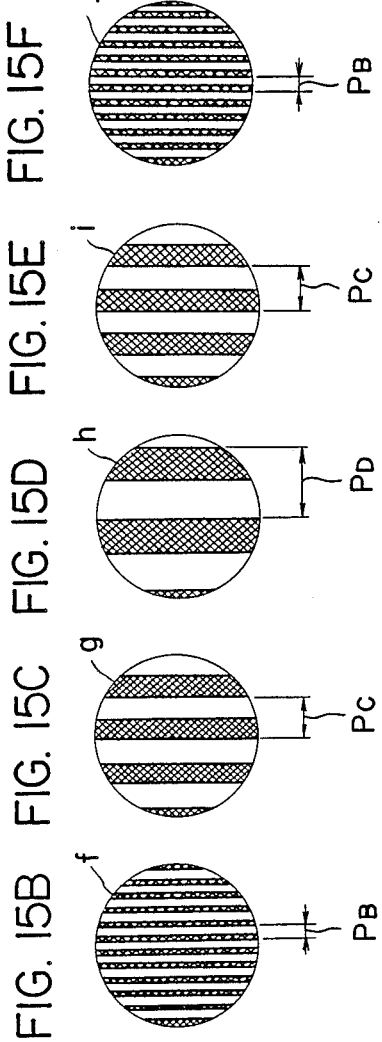

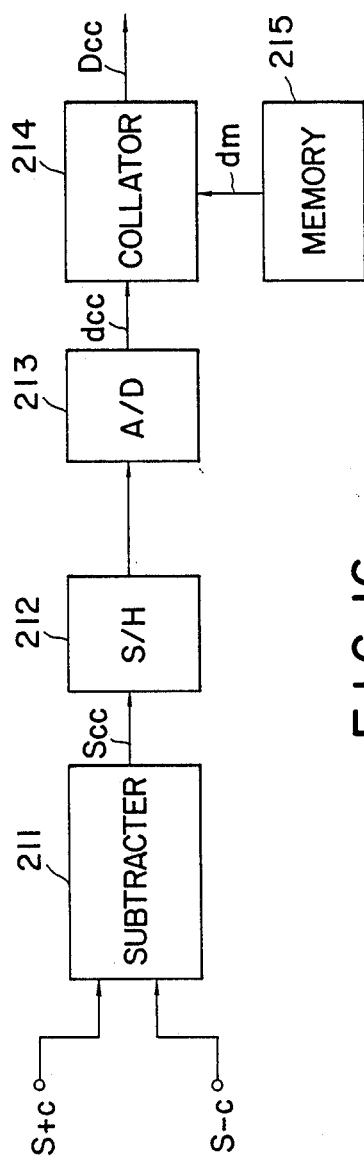
F I G. 16
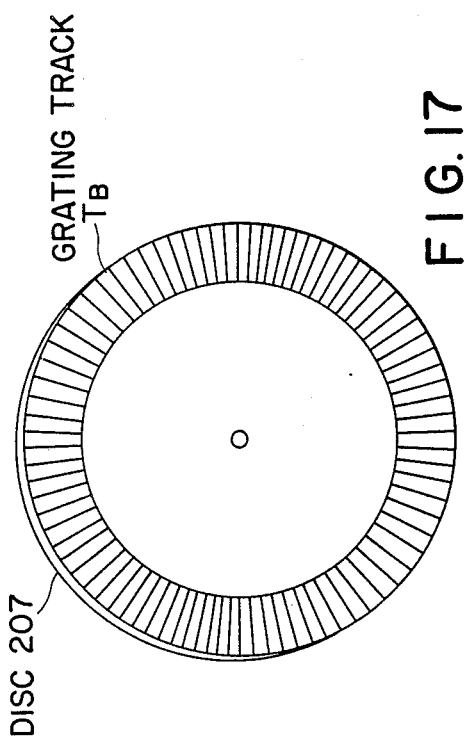
F I G. 17

FIG. 20A

GRATING TRACK Tc

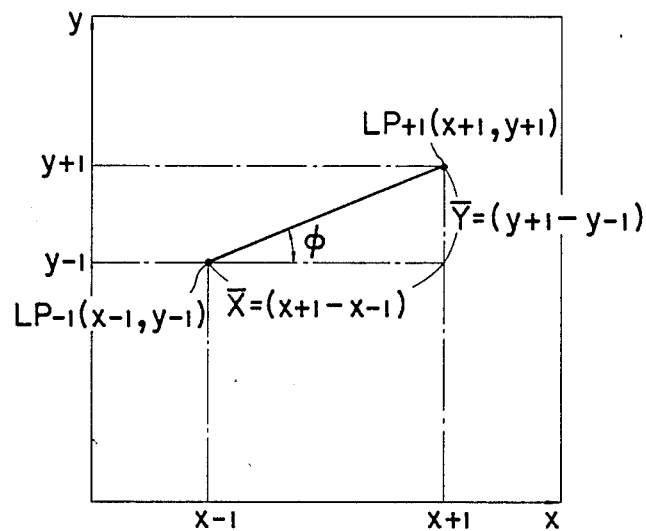
F I G. 22
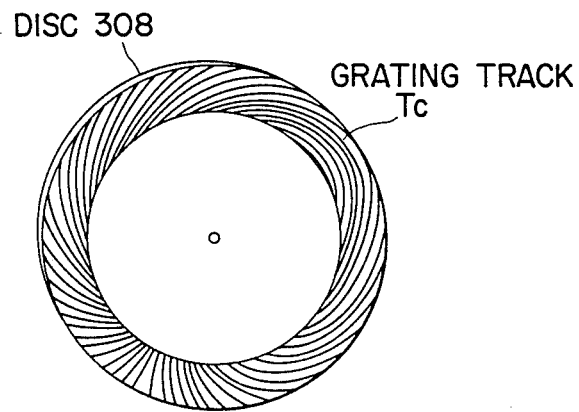
F I G. 24

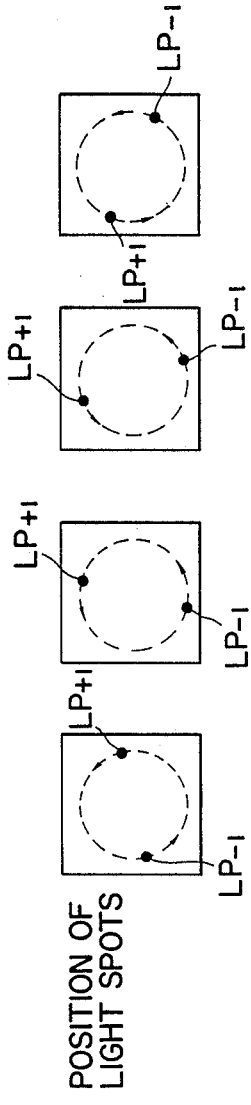
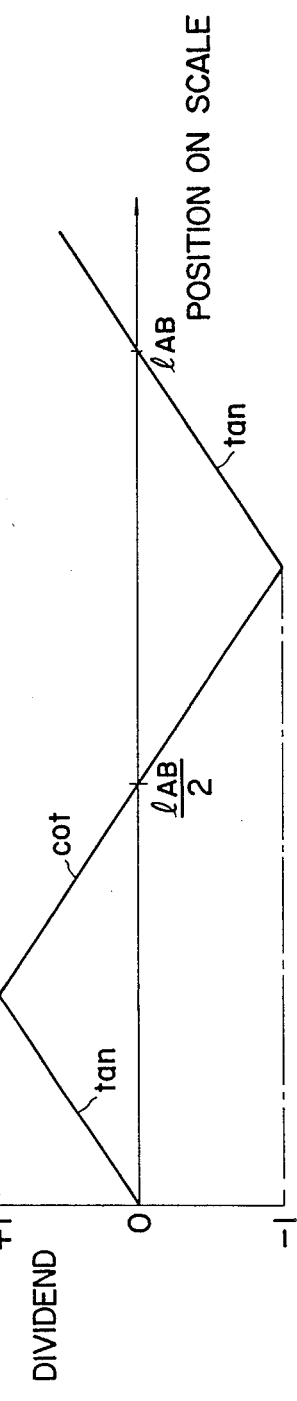

OPTICAL ENCODER WITH VARYING GRATING PITCH

This application is a divisional of Application Serial No. 07/251,089, filed Sept. 29, 1988.

BACKGROUND OF THE INVENTION

This invention relates to an optical encoder which is applicable to positional measurement techniques for machine tools such as lathes, milling machines or the like, and for semiconductor manufacturing systems.

FIG. 1 is a perspective structural view showing an example of a prior art optical system 10. That is, an absolute type optical encoder is shown which includes a luminous element 11 such as a LED (light emitting diode), a lamp or the like for emitting measurement light La, and a collimating lens 12 for collimating the light La emitted from the luminous element 11 into parallel light Lb. A first scale 13 is provided having n parallel grating tracks $t_1, t_2, \ldots, t_n$ arranged on the surface thereof (n is an integer). Each grating track $t_1, t_2, \ldots, t_n$ includes sections 13A (referred to as transmission sections herein) which allow the parallel light Lb which has passed through the collimating lens 12 to pass therethrough, and sections 13B (referred to as non-transmission sections herein) which does not allow the parallel light Lb to transmit therethrough, alternating in a predetermined length (referred to as a grating pitch herein). A second scale 14 is provided with transmission windows $14A_1, 14A_2, \ldots, 14A_n$ which allow light beams (not shown) passing through the transmission sections 13A to pass therethrough and are arranged according to the respective grating tracks $t_1, t_2, \ldots, t_n$ of the first scale 13. Photo detectors 15-1, 15-2, ..., 15-n are arranged according to the respective transmission windows $14A_1, 14A_2, \ldots, 14A_n$ so as to convert the light beams $L_{c1}, L_{c2}, \ldots, L_{c3}$ passing through the respective transmission windows $14A_1, 14A_2, \ldots, 14A_n$ into electric signals according to their intensities.

The first scale 13 used in the optical system 10 in the prior art absolute type optical encoder is provided with reflected binary codes (Gray codes) as shown in FIG. 2 wherein grating pitches $P_1, P_2, P_3, \ldots P_{n-1}, P_n$ between the adjacent grating tracks $t_1$ and $t_2$; $t_2$ and $t_3$; ...; $t_{n-1}$ and $t_n$ have a ratio of 1:2. Accordingly, the intensities of the light beams $L_{c1}, L_{c2}, L_{c3}, \ldots, L_{cn-1}, L_{cn}$ transmitted through the transmission sections 13A of the respective grating tracks $t_1, t_2, t_3, \ldots, t_{n-1}, t_n$ of the first scale 13 and the transmission windows $14A_1, 14A_2, 14A_3, \ldots, 14A_{n-1}, 14A_n$ of the second scale 14 corresponding to the grating tracks $t_1, t_2, t_3, \ldots, t_{n-1}, t_n$ of the first scale 13 and received by the respective photo detectors 15-1, 15-2, 15-3, ..., 15-n-1, 15-n corresponding to the transmission windows $14A_1, 14A_2, 14A_3, \ldots, 14A_{n-1}, 14A_n$ periodically change since the first scale 13 moves in a longitudinal direction (the direction marked by an arrow m). Responsive to the changes, the electric signals converted by the respective photo detectors 15-1, 15-2, 15-3, ..., 15-n-1, 15-n change periodically. FIG. 3 graphically shows such periodical changes of the electric signals $S_1, S_2, S_3, \ldots, S_{n-1}, S_n$ wherein a displacement ml of the first scale 13 in the longitudinal direction is plotted on a horizontal axis while the electric signals $S_1, S_2, S_3, \ldots, S_{n-1}, S_n$ converted by the respective photo detectors 15-1, 15-2, 15-3, ..., 15-n-1, 15-n are plotted on a vertical axis. FIG. 4 is a block diagram of an absolute type optical encoder wherein the electric signals $S_1, S_2, S_3, \ldots, S_{n-1}, S_n$ are digitized by respective comparators 20 into digital signals $d_1, d_2, d_3, \ldots, d_{n-1}, d_n$ and further converted from the reflected binary codes into an absolute positional data D of desired form, such as simple binary codes or a BCD code, by a decoder 30.

There are demands to improve a resolutional detection of a conventional absolute type optical encoder so as to enable detection of minute displacements, and to enable detection of absolute positions of a longer stroke. However, the conventional absolute type optical encoder is defective in that its resolutional detection is limited in such a way that the detection of positions which are smaller than the grating pitch $P_n$ in the track $t_n$, which is segmented into the smallest possible segments, is impossible, and the detection stroke in its absolute positional detection remains at a level similar to the grating pitch $P_1$ of the track $t_1$, which is segmented into the largest possible segments. If an attempt is made to improve its resolutional detection and to extend the detection stroke, the number of grating tracks inevitably increases to enlarge the size of the absolute type optical encoder, or to inconveniently increase the number of components such as photo detectors and comparators.

SUMMARY OF THE INVENTION

An object of this invention is to provide a compact optical encoder having a higher resolution in positional detection and having a longer detection stroke in absolute positional detection as compared to prior art encoders.

According to one aspect of this invention, for achieving the objects described above, there is provided an optical encoder including a light source unit for emitting coherent parallel light, a scale having a grating track of the same pitch throughout, but differing in the ratio between non-transmission sections to transmission sections, which diffracts the coherent parallel light emitted from the light source unit, and a photo detecting unit for receiving the plural diffracted light beams of different orders out of the light beams diffracted by said scale and for converting the diffracted light beams of different orders into electric signals according to the intensities thereof.

According to another aspect of this invention, there is provided an optical encoder including a light source unit for emitting coherent parallel light, a scale having a grating track of the same ratio, but of different pitches between non-transmission sections and transmission sections, which diffracts the coherent parallel light emitted from the light source unit, and a light spot position detecting unit for receiving positive and negative diffracted light beams of the same order out of light beams diffracted by said scale, and for detecting light spot positions of the respective positive and negative diffracted light beams of the same order, and for converting the light spot positions into electric signals.

Further, according to still another aspect of this invention, there is provided an optical encoder including a light source unit for emitting coherent parallel light, a scale having a grating track of the same ratio and pitch between non-transmission sections and transmission sections which diffracts the coherent parallel light emitted from the light source unit, and a light spot position detecting unit for receiving positive and negative diffracted light beams of the same order of out light for receiving positive and negative diffracted light beams of the same order out of light beams diffracted by the scale, and for detecting light spot positions of the respective positive and negative diffracted light beams of the same order, and for converting the light spot positions into electric signals.

The nature, principle and utility of the invention will become more apparent from the following detailed description when read in conjunction with the accompanying drawings.

BRIEF DESCRIPTION OF THE DRAWINGS

In the accompanying drawings:

FIGS. 9A, 9B, 9C, 9D, 9E, and 9F are views showing an embodiment of a grating track thereof;

FIGS. 15A, 15B, 15C, 15D, 15E, and 15F are views showing an embodiment of a grating track thereof;

FIG. 16 is a block diagram showing an embodiment of a detection circuit thereof;

FIG. 17 is a perspective view showing another application of a grating track;

FIGS. 20A, 20B, 20C, 20D, 20E, 20F, 20G, 20H, 20I, 20J, and 20K are views showing an embodiment of a grating track thereof;

FIGS. 22 and 23A, 23B, 23C, 23D, 23E, and 23F are explanatory views used to illustrate detecting methods respectively; and FIG. 24 is a perspective view showing another application of a grating track thereof.

DESCRIPTION OF THE PREFERRED EMBODIMENTS

The principle of the first embodiment of this invention is described below.

Figure 1:
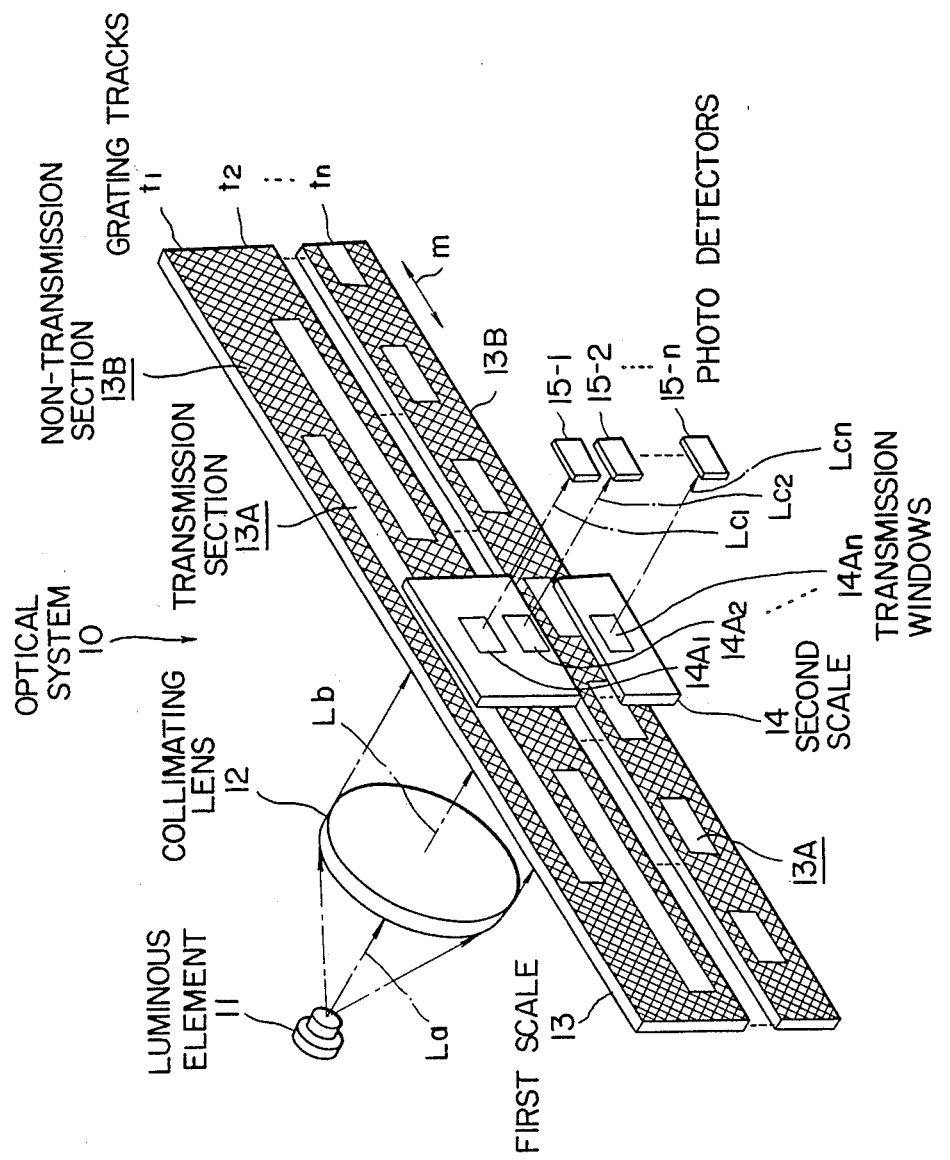
FIG. 1 is a perspective structural view showing an example of an optical system of a conventional optical encoder.
Figure 2:
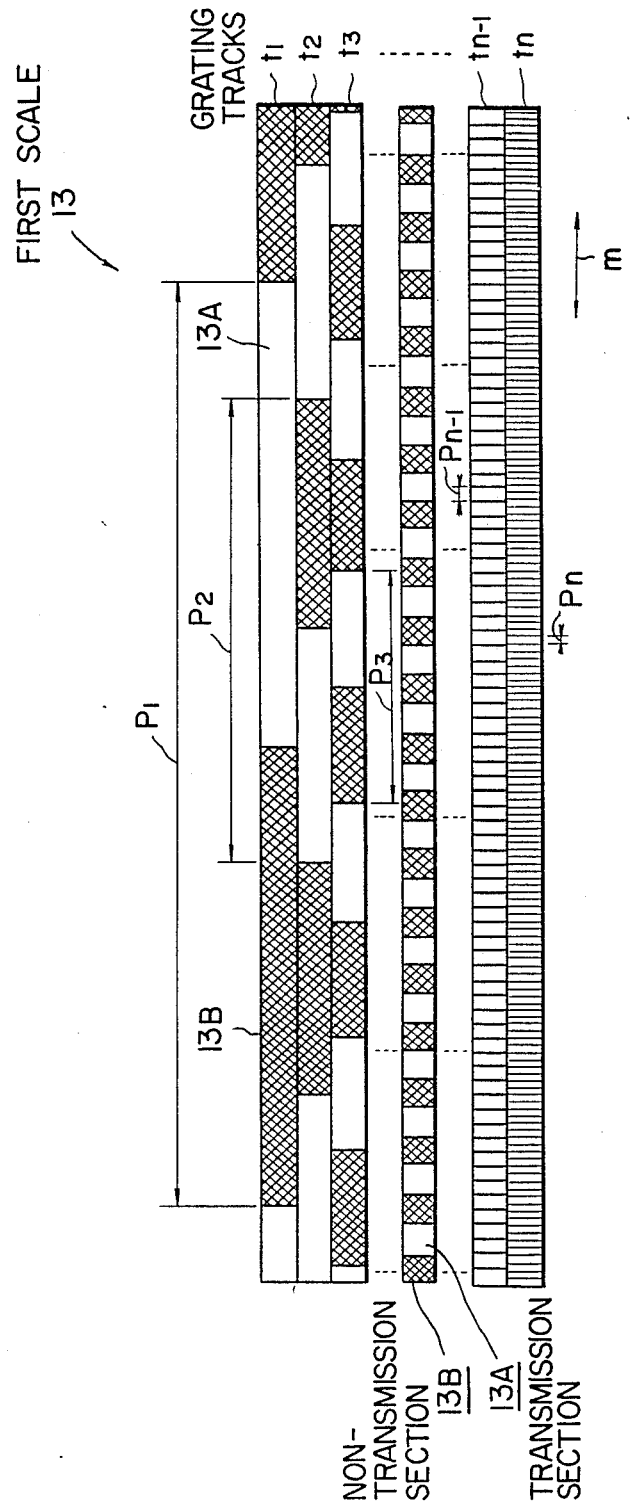
FIG. 2 is a view showing an example of a grating track thereof.
Figure 3:
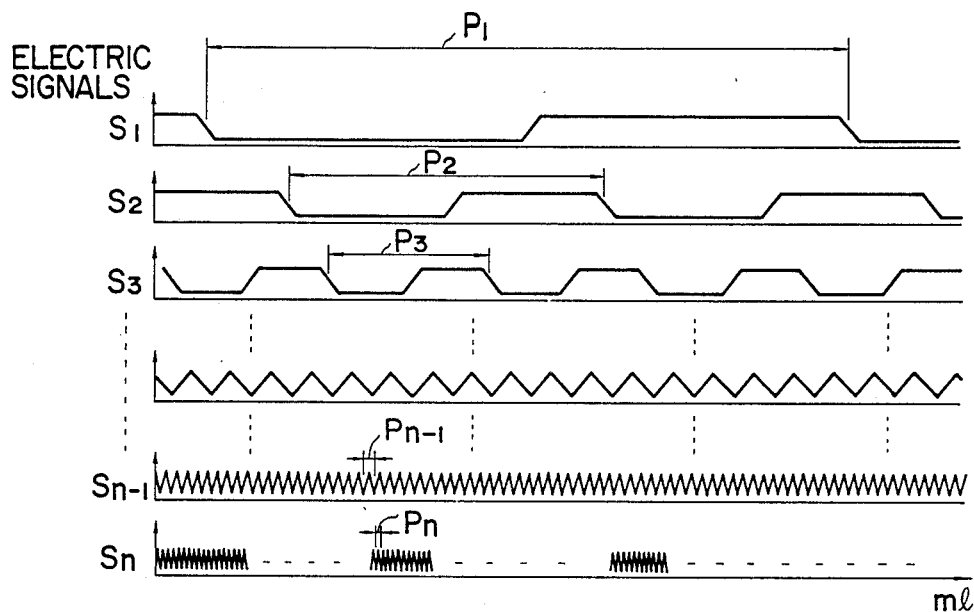
FIG. 3 is a graph showing an example of electric signals thereof.
Figure 4:
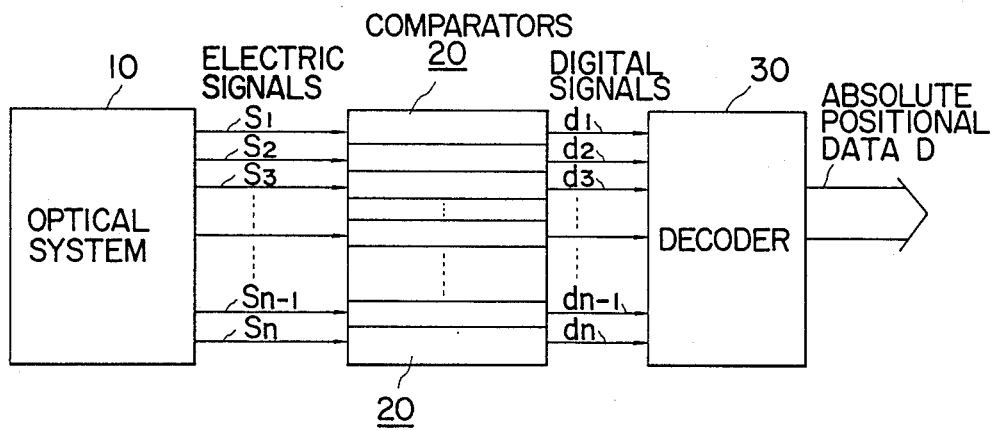
FIG. 4 is a block diagram showing an example of a detection circuit thereof.
Figure 5:
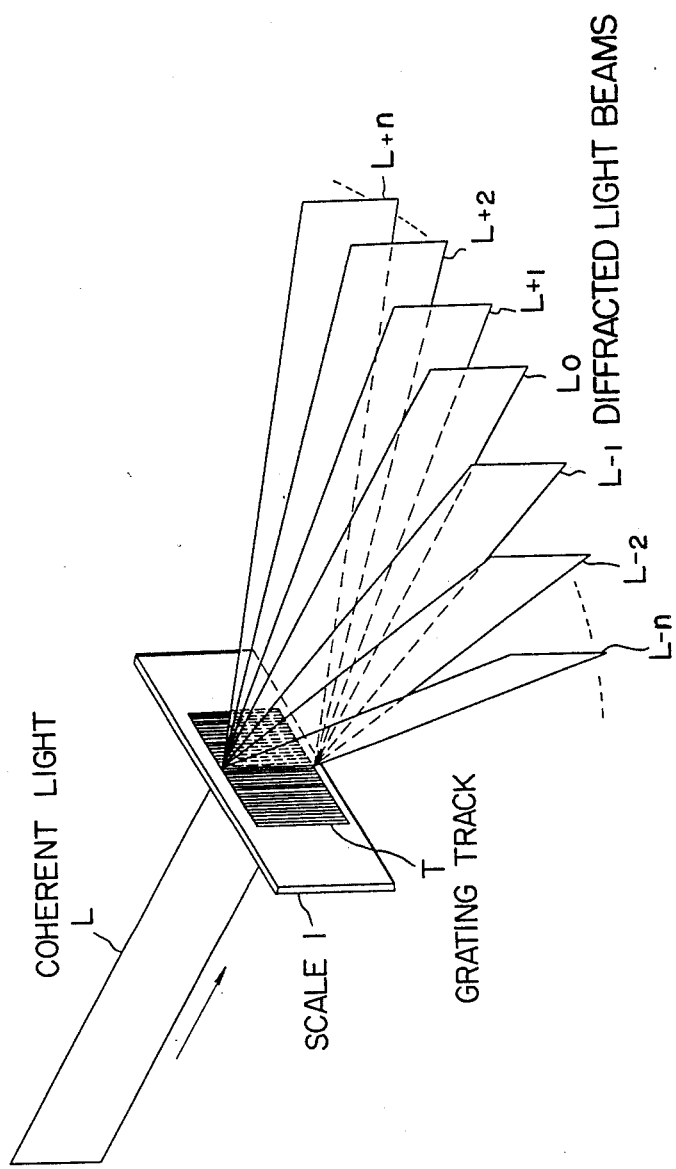
FIG. 5, FIG. 6, and FIG. 7 are view used to describe a principle of this invention in a first embodiment.
Figure 6:
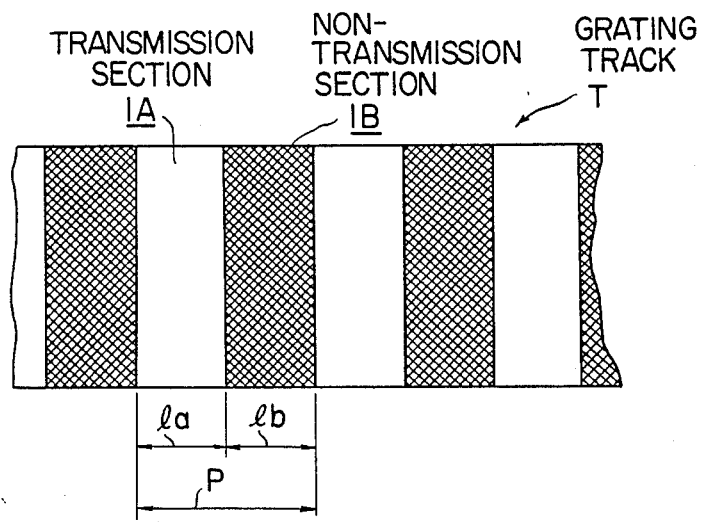

As shown in FIG. 5, when coherent light L such as a laser beam is directed onto scale 1 having a surface provided with a grating track T having transmission sections and non-transmission sections alternating at a predetermined pitch, the coherent light L which has passed through the transmission sections is diffracted into plural diffracted light beams $L_0, L_{\pm 1}, L_{\pm 2}, \ldots, L_{\pm n}$ (hereinafter referred to as nth-order diffracted light beams (n is an integer)). FIG. 6 shows the aforementioned grating track T. A ratio Q (hereinafter referred to as an aperture ratio) of the transmission section 1A in a grating pitch can be represented by the following expression (1), where a length of the transmission section 1A is denoted as la, that of the non-transmission section 1B as lb, and the pitch of the grating as P.

$$Q = \frac{la}{P} \quad (1)$$

A ratio I in intensity between the nth-order diffracted light beam $L_{\pm n}$ and the 0th-order diffracted light $L_o$ is represented by the following expression (2).

$$I = \frac{\sin^2(n\pi Q)}{(n\pi Q)^2} \quad (2)$$

Figure 7:
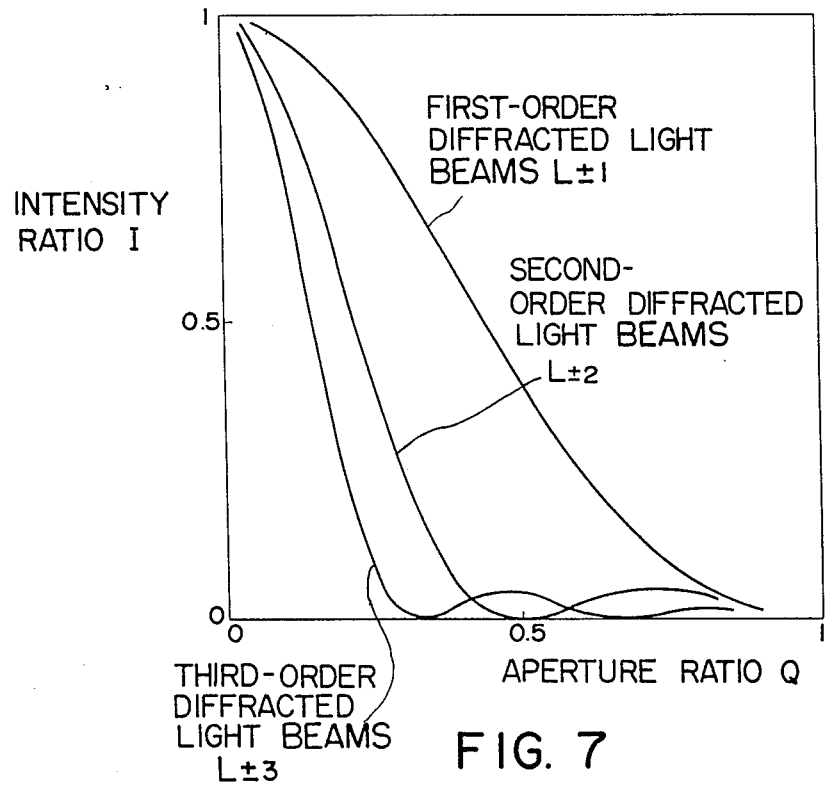

FIG. 7 is a graph showing the relationship between the aperture ratio Q and the respective intensity I of the first-order diffracted light beams $L_{\pm 1}$, the second-order diffracted light beams $L_{\pm 2}$, and the third-order diffracted light beams $L_{\pm 3}$. As is obvious from the graph, the intensity ratio I varies among the diffracted light beams $L_{\pm 1}$, $L_{\pm 2}$, $L_{\pm 3}$ since the aperture ratio Q varies. Positions on the scale can therefore be detected by detecting the intensity ratio I of two arbitrary diffracted light beams of different orders which can be obtained by directing the coherent light I into the scale having a grating track of various aperture ratios Q on the surface thereof.

The first embodiment of this invention will now be described.

Figure 8:
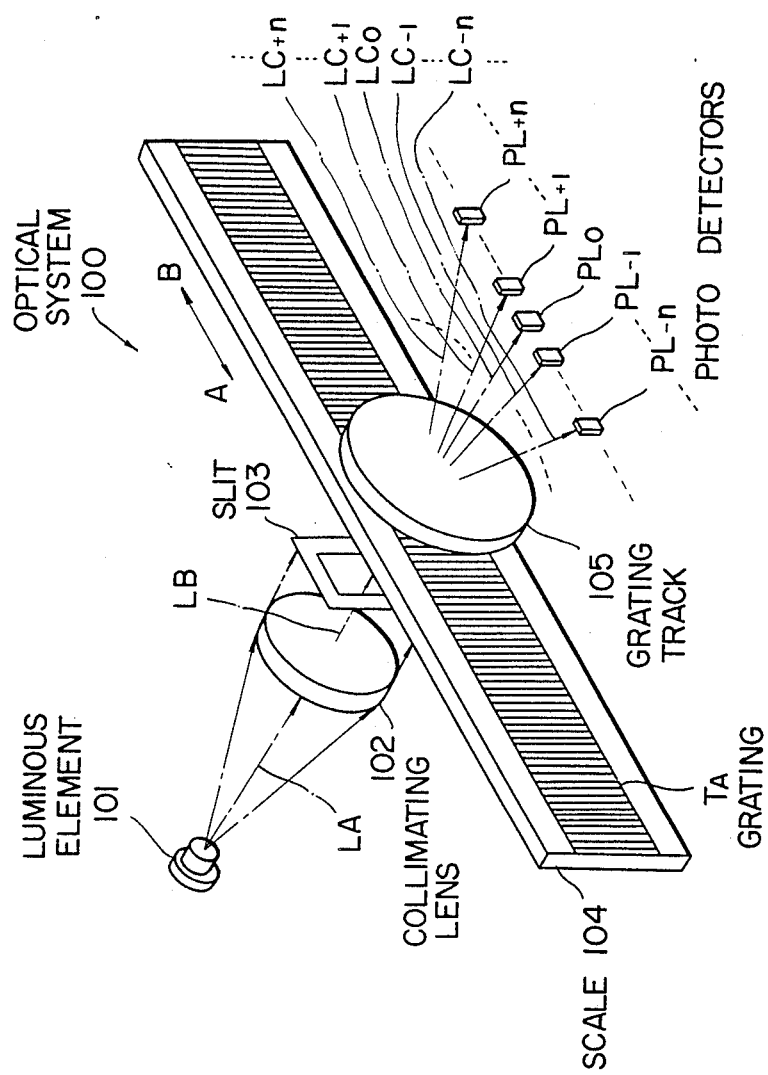
FIG. 8 is a perspective structural view showing an embodiment of an optical system thereof.

FIG. 8 is a perspective structural view used to show an embodiment of an optical system of an optical absolute encoder according to this invention which includes a luminous element 101 such as an I.D. (laser diode) for emitting coherent light LA, a collimating leans 102 for collimating the coherent light LA into parallel light LB, a slit 103 for allowing the parallel light LB to partially pass therethrough to become a flux of light of a predetermined width (not shown), and elongated scale 104 having on the surface thereof a grating tract $T_A$ where sections which transmit the light flux and non-transmission sections are alternated at a predetermined pitch, a focusing lens 105 which focuses plural diffracted light beams (not shown) diffracted by the grating tract $T_A$, and photo detectors $PL_0, PL_{+1}, \ldots, PL_{+n}$ which are arranged according to respective diffracted light beams $LC_o, LC_{+1}, \ldots, LC_{+n}$ from the focusing lens 105 and which cover the respective diffracted light beams $LC_0, LC_{+1}, \ldots, LC_{+n}$ into electric signals according to their intensities. The luminous element 101, the collimating lens 102, the slit 103 and the focusing lens 105 are fixed in a linear arrangement and may be moved relatively to the scale 104. As shown in the figure, however, the scale 104 is adapted to move linearly in the longitudinal direction A or B.

The scale 104 used in the optical system 100 of the absolute type optical encoder of the above structure is provided with the grating track $T_A$ where the grating pitch Pa (several μm to several tens of μm) is constant over an entire length of the scale 104, but the aperture ratio Q smoothly varies along the distance $l_{ab}$ as shown in FIG. 9A–9F e.g. the aperture ratios are 0.5 at a point a, 0.75 at a point b, 0.5 at a point c, 0.25 at a point d and 0.5 at a point e. The intensities of the diffracted light beams $LC_0, LC_{+1}, \ldots, LC_{+n}$ which enter into the photo detectors $PL_0, PL_{+1}, \ldots, PL_{+n}$ periodically change since the aperture ration Q changes when the scale 104 moves in the longitudinal direction A or B. Responsive to such changes, the respective electric signals converted at the photo detectors $PL_0, PL_{+1}, \ldots, PL_{+n}$ periodically change.

As described above, since the aperture ratio is used simply to obtain the intensity ratio of diffracted light, the aperture ratio along the distance $l_{ab}$ may be changed arbitrarily so that the electric signals which increase at a certain rate, since the scale 104 moves, or which change into sine waves or triangle waves can be obtained easily. By using the intensity ratio of two arbitrary diffracted light beams of different orders or the ratio of the electric signals, the position on the scale can be simply detected.

Figure 10:
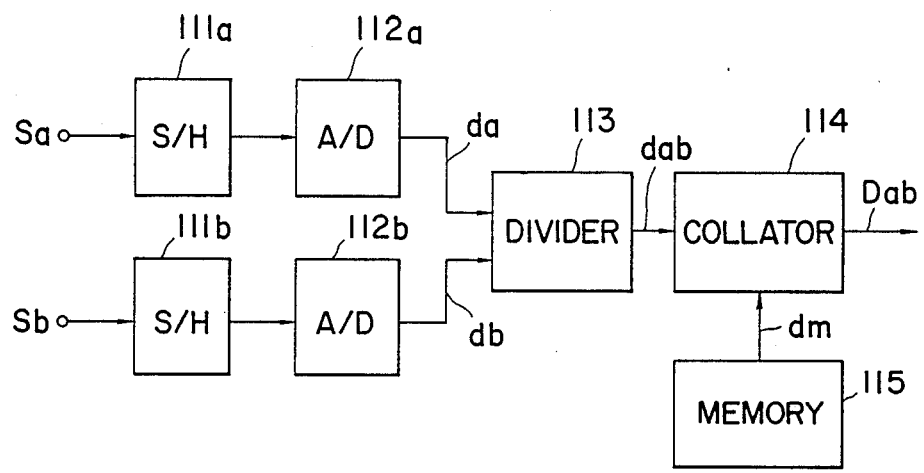
FIG. 10 is a block diagram showing an embodiment of a detection circuit thereof.

FIG. 10 is a block diagram showing an embodiment of a reader which obtains a positional data from the electric signals of the aforementioned photo detectors. In a manner as mentioned above, two arbitrary diffracted light beams of different orders are selected. For instance, electric signals Sa and Sb from the photo detectors $PL_0$ and $PL_{+1}$, which convert the 0th-order diffracted light beam $LC_0$ and the first-order diffracted light beam $LC_{+1}$ into electric signals, are digitized into digital data signals $d_a$ and $d_b$ by sample-and-hold circuits 111a and 111b and A/D converters 112a and 112b. the digital data signals $d_a$ and $d_b$ are divided by a divider 113 to become a digital data $d_{ab}$ which expresses a ratio and which is outputted to a collator 114. A memory 115 stores in advance the ratios of the electric signals which represent respectively the intensities of the two diffracted light beams $LC_0$ and $LC_{+1}$ of different orders corresponding to the grating track patterns, and the positional data signals corresponding to the ratios. The ratio dm of the electric signals read out of the memory 115 is referred to the ratio $D_{ab}$ of the electric signals obtained by the divider 113 so as to output an appropriate positional data $D_{ab}$ on the scale.

Figure 11:
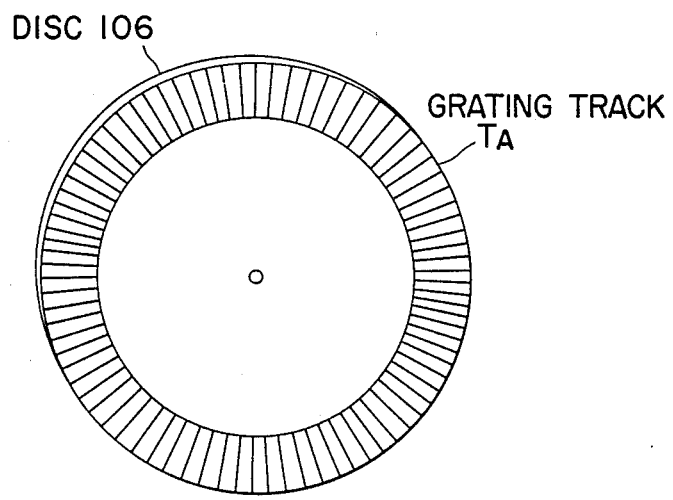
FIG. 11 is a perspective view showing another application of a grating track.

Although in the aforementioned first embodiment the coherent light emitted from the luminous element is transmitted into the scale to obtain the diffracted light beams, it may instead be reflected from the scale to obtain the diffracted light beams since transmitted light and reflected light have the same properties. When the coherent light is reflected, the luminous element, the collimating lens, the slit, the focusing lens and the photo detectors are arranged on the same side as the scale, and the scale comprises sections which reflect light and sections which do not reflect light. If the scale is made into a disc 106 as shown in FIG. 11, and the grating track $T_A$ is arranged annularly on the surface thereof and the disc 106 may be rotated around the center thereof, the angles can be detected in absolute fashion. Although in the aforementioned embodiment, the light source and the photo detectors are fixed while the scale is moved for a positional detection, the scale may be fixed while the light source and the photo detectors are moved to achieve a similar effect in a positional detection.

In the first embodiment, the grating track has different ratios between the non-transmission sections and the transmission sections, but has the same pitch and grating line direction over the entire length. The positions are detected by the intensity ratios of the plural diffracted light beams of different orders. The same effect can be achieved in positional detection according to a principle of the second embodiment which will be described below.

Figure 12:
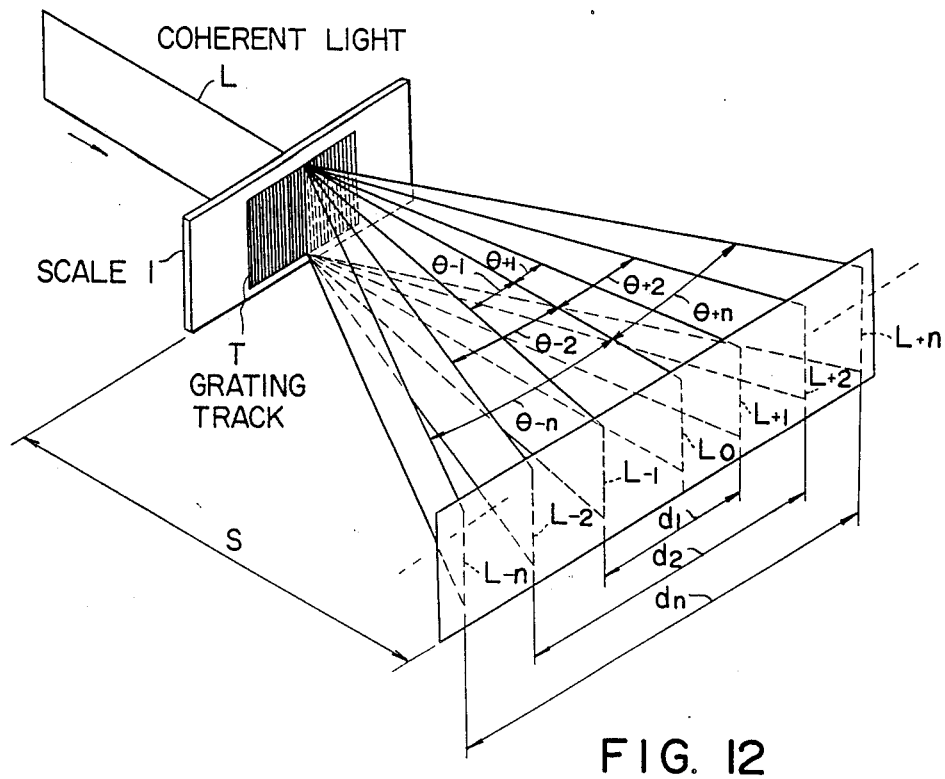
FIGS. 12 and 13 are views used to explain a principle of this invention in a second embodiment.

As shown in FIG. 12, when coherent light L such as a laser beam is directed into a scale 1 having a surface provided with a grating track T transmission sections and non-transmission sections alternating at a predetermined pitch, the coherent light L which passes through the transmission sections is diffracted into plural diffracted light beams $L_0, L_{+1}, L_{+2}, \ldots, L_{+n}$ (hereinafter referred to as nth-order diffracted light beams (n is an integer)). Angles $\pm\theta_n$ (referred to as the diffraction angles) formed by the positive and negative nth-order diffracted light beams $L_{+n}, L_{-n}$ and the coherent light L can be expressed by the following expression (3) using a wavelength $\lambda$ of the coherent light L and a pitch P of the grating track T.

$$\pm\Theta_n = \pm\sin^{-1}\left(\frac{n\lambda}{P}\right) \quad (3)$$

A distance $d_n$ between the positive and negative diffracted light beams $L_{+n}$ and $L_{-n}$ as projected onto a screen which is located from the scale 1 by a distance S is represented by the following expression (4).

$$d_n = 2S\tan\left\{\sin^{-1}\left(\frac{n\lambda}{P}\right)\right\} \quad (4)$$

Figure 13:
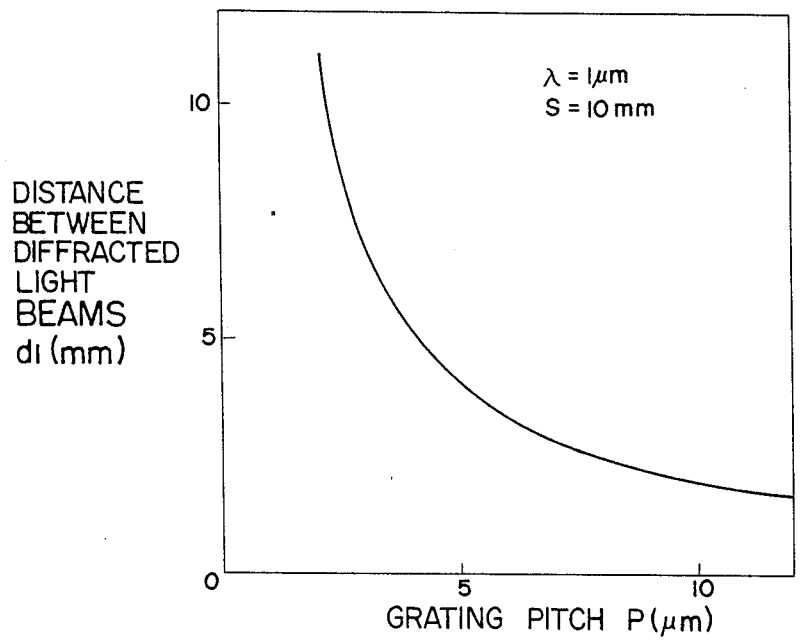

FIG. 13 is a graph showing the relationship of the distance $d_1$ between the positive and negative first-order diffracted light beams $L_{+1}, L_{-1}$, and the grating pitch P when the wavelength $\lambda$ of the coherent light L is set at 1 $\mu$m and the distance S between the scale 1 and the screen 2 is set at 10 mm. As is obvious from the graph, as the grating pitch P varies, the distance $d_1$ varies. If the coherent light L is directed into a scale having a grating track with different pitches P at different locations along the grating to obtain selected positive and negative diffracted light beams $L_{+n}, L_{-n}$ of the same order, then positional detection on the scale can be effected using the distance $d_n$ between the above two diffracted light beams.

The second embodiment of this invention will now be described.

Figure 14:
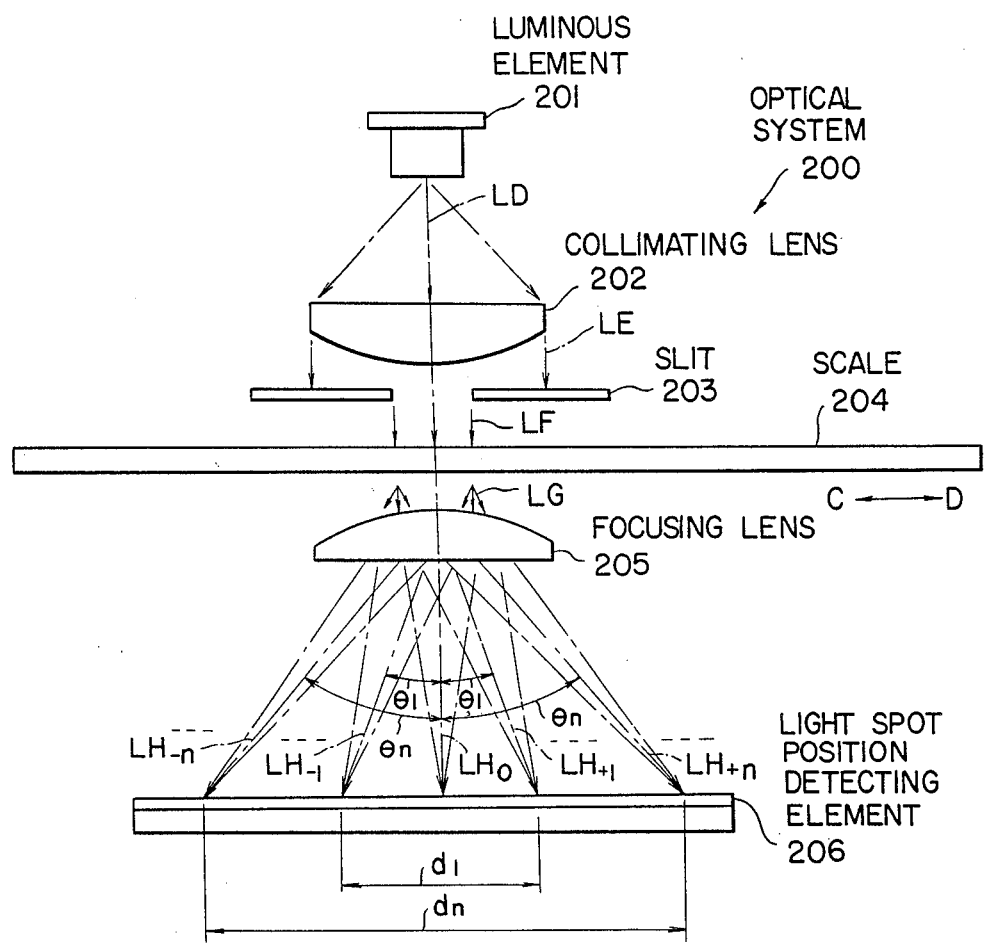
FIG. 14 is a structural view showing an embodiment of an optical system thereof.

FIG. 14 is a structural view showing an embodiment of an optical system of an optical absolute encoder according to this invention which comprises a luminous element 201 such as an L.D. (laser diode) for emitting coherent light LD, a collimating lens 202 for collimating the coherent light LD into parallel light LE, a slit 203 for allowing the parallel light LE to partially pass therethrough to become a flux LF of light of a predetermined width, an elongated scale 204 having on the surface thereof a grating track $T_B$ where sections which transmit the light flux LF and non-transmission sections are alternated at the same aperture ratio but in different pitches, a focusing lens 205 which focuses plural diffracted light beams LG diffracted by the grating trace $T_B$, and a light spot position detecting element 206 such as an image sensor for detecting positions of light spots of respective diffracted light beams $LH_0, LH_{+1}, \ldots, LH_{+n}$ from the focusing lens 205 and for converting the positions of the light spots into electric signals. The luminous element 201, the collimating lens 202, the slit 203 and the focusing lens 205 are fixed in a linear arrangement and may be moved relative to the scale 204. As shown in the figure, however, the scale 204 is adapted to move linearly in the longitudinal direction C or D.

The scale 204 used in the optical system 200 of the absolute type optical encoder of the above structure is provided with the grating tract $T_B$ having grating pitches which smoothly and gradually change along a distance $L_{ab}$ as shown in FIGs. 15A–15F (e.g. the grating pitches are $P_b$ at a point f, $P_c$ at a point g, $P_d$ at a point h, $P_c$ at a point i and $P_b$ at a point j). The diffraction angles of the respective diffracted light beams $LH\pm_1, \ldots, LH\pm_n$ incident on the light spot position detecting element 206 periodically change respectively since the scale 204 moves longitudinally to vary the grating pitches. The light spot positions of the respective diffracted light beams $LH\pm_1, \ldots, LH\pm_n$ focusing on the light spot position detecting element 206 change responsive to the above periodic changes. More particularly, the smaller the grating pitch, the larger the diffraction angle becomes thereby widening the distance between the positive and negative diffracted light beams of the same order. Conversely, the larger the grating pitch, the smaller the diffraction angel becomes thereby narrowing the distance between the positive and negative diffracted light beams of the same order.

As described above, the grating pitch is used to vary the diffraction angle, and therefore it is possible to arbitrarily change the grating pitches along the distance $L_{ab}$ so as to easily obtain the electric signals which increase at a certain rate, since the scale 204 moves, or which change into sine waves or triangle waves. The position on the scale can therefore be detected from the distance between arbitrarily chosen positive and negative diffracted light beams of the same order.

FIG. 16 is a block diagram showing an embodiment of a reader which obtains a positional data from the electric signals of the above-mentioned light spot position detecting element 206. As mentioned above, positive and negative diffracted light beams of the same order are arbitrarily selected. For instance, positions of the two light spots of the first-order diffracted light beams $LH\pm_1$ are respectively converted into electric signals $S+c$ and $S-c$ by the light spot position detecting element 206. The electric signals $S\pm_c$ are converted by a subtracter 211 into an electric signal $S_{cc}$ to express a distance between the first-order diffracted light beams $LH\pm_1$, the electric signal $S_{cc}$ is converted into digital data $d_{cc}$ by a sample-and-hold circuit 212 and an A/D converter 213, and the digital data $d_{cc}$ is outputted to a collator 214. A memory 215 stores in advance the distances between the positive and negative first-order diffracted light beams corresponding to the grating track patterns, and the positional data corresponding to the distances. The distance dm between each set of the diffracted light beams read out of the memory 215 is referred to the digitized distance $d_{cc}$ of the particular set of diffracted light beams so as to output an appropriate positional data $D_{cc}$ on the scale.

Although in the aforementioned second embodiment, the coherent light emitted from the luminous element is transmitted into the scale to obtain the diffracted light beams, it may instead be reflected from thee scale to obtain the diffracted light beams since transmitted light and reflected light have the same properties. When the light is reflected, the luminous element, the collimating lens, the slit, the focusing lens and the light spot position detecting element are arranged on the same side as the scale, and the scale comprises sections which reflect light and sections which do not reflect light. If the scale is made into a disc 207 as shown in FIG. 17, and the grating track $T_B$ is arranged annularly on the surface thereof, the disc 207 may be rotated around the center thereof, and the angles can be detected in absolute fashion. Although in the aforementioned embodiment, the light source and the light spot position detecting element are fixed while the scale is moved for positional detection, the scale may instead be fixed while the light source and the light spot position detecting element are moved to achieve a similar effect in positional detection.

In the second embodiment, the grating track has different pitches of the non-transmission sections and the transmission sections, but has the same aperture ratio and grating line direction over the entire length. The positions are detected by the distances between the plural diffracted light beams of the same order. The same effect can be achieved in positional detection according to a principle of the third embodiment which will be described below.

Figure 18:
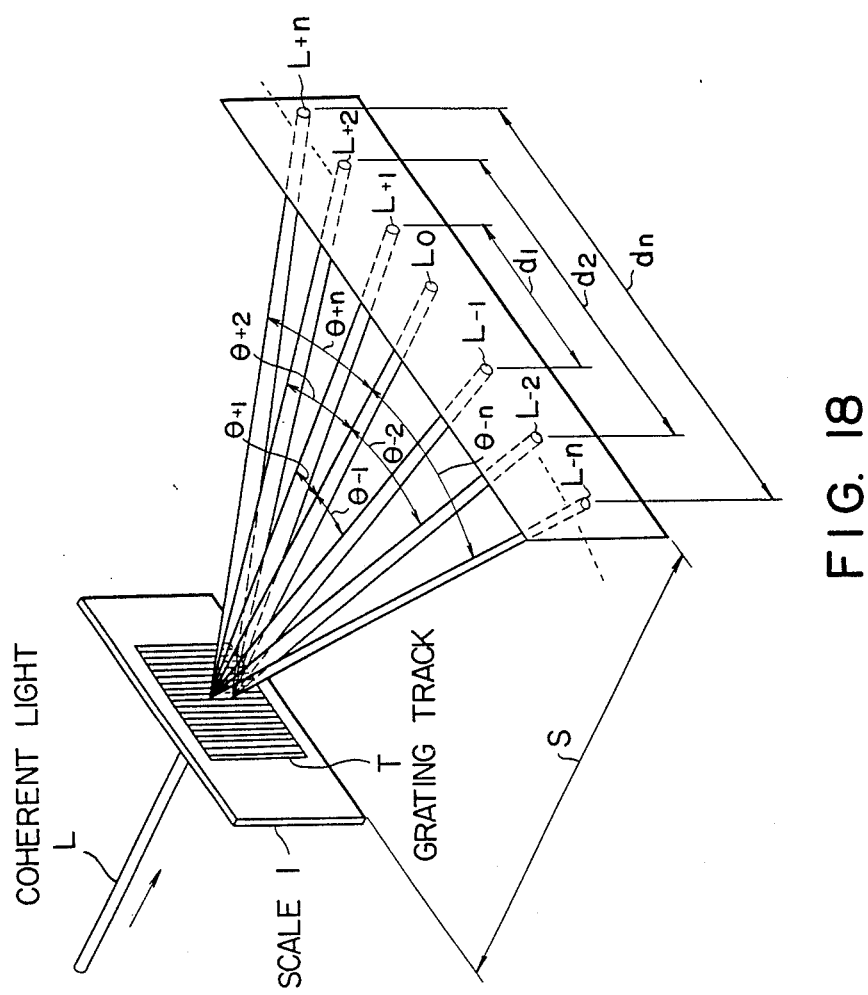
FIG. 18 is a view used to explain a principle of this invention in a third embodiment.

As shown in FIG. 18, when coherent light L such as a laser beam is directed into a scale 1 having a surface provided with a grating track T having transmission sections and non-transmission sections alternating at a predetermined pitch, the coherent light L passing through the transmission sections is diffracted into plural diffracted light beams $L_0, L\pm_1, L\pm_2, \ldots, L\pm_n$ (hereinafter referred to as nth-order diffracted light beams (n is an integer)). Angles $\pm_n$ (referred to as the diffraction angles) formed by the positive and negative nth-order diffracted light beams $L_{30\,n}, L_{-n}$ and the coherent light L can be expressed by the following expression (5) using a wavelength $\lambda$ of the coherent light L and a pitch P of the grating track T.

$$\pm\Theta_n = \pm\sin^{-1}\left(\frac{n\lambda}{P}\right) \quad (5)$$

Therefore, light spots of the positive and negative diffracted light beams $L_{+1}$ and $L_{-1}$ projected onto a screen 2 located from the scale 1 by a distance S are positioned from each other on a line which is orthogonal to the grating line by a distance $d_n$. The distance $d_n$ is expressed by the expression (6) below.

$$d_n = 2S \tan\left(\sin^{-1}\left(\frac{n\lambda}{P}\right)\right) \quad (6)$$

If the coherent light L is directed into a scale provided with a grating track having different grating line directions at different locations, and light spots are obtained from arbitrarily chosen positive and negative diffracted light beams $L_{+n}$ and $L_{-n}$ of the same order, then positional detection on the scale can be effected according to the angle of movement (rotations) of the light spots.

The third embodiment of this invention will now be described.

Figure 19:
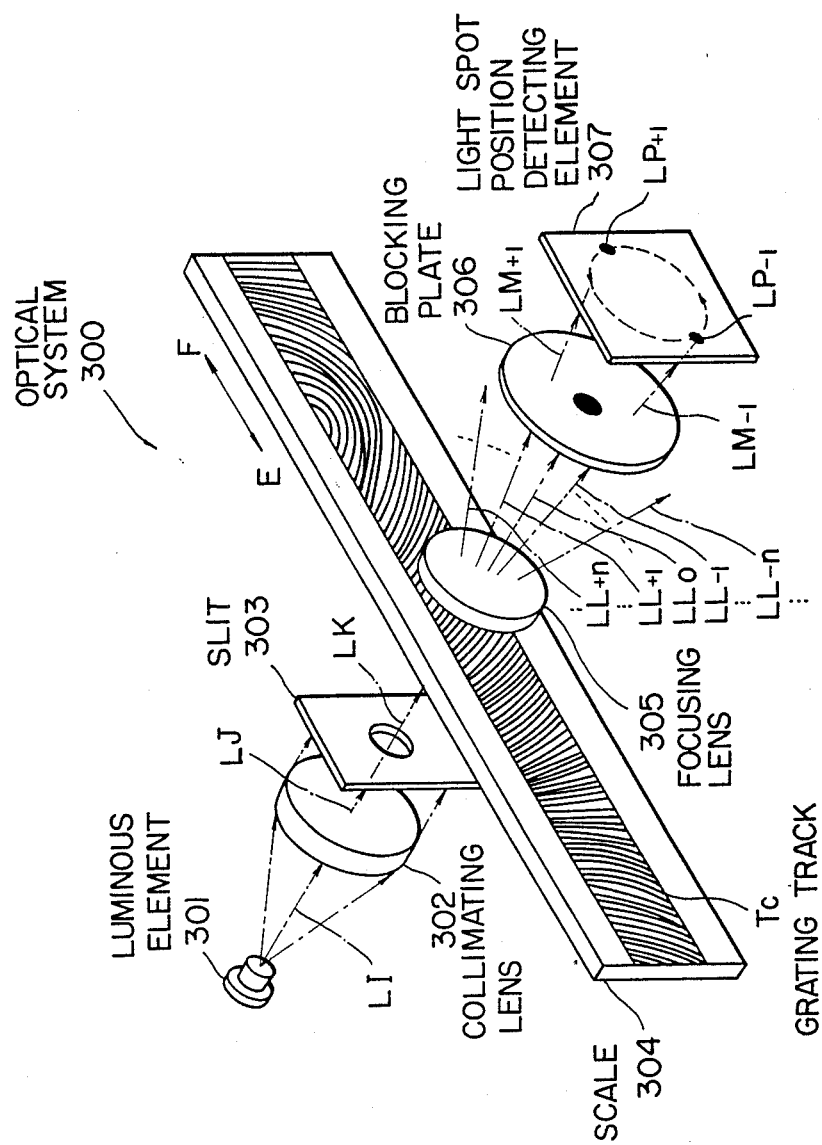
FIG. 19 is a perspective structural view showing an embodiment of an optical system thereof.

FIG. 19 is a structural view showing an embodiment of an optical system of an optical absolute encoder according to this invention which comprises a luminous element 301 such as an L.D. (laser diode) for emitting coherent light LI, a collimating lens 302 for collimating the coherent light LI 301 into parallel light LJ, a slit 303 for allowing the parallel light LJ to partially pass therethrough to become a flux LK of light of a predetermined width, an elongated scale 304 having a surface provided with grating tract $T_c$ where sections which transmit the light flux LK and non-transmission sections are alternated at the same aperture ratio and pitch but in different directions, a focusing lens 305 which focuses plural diffracted light beams (not shown) diffracted by the grating tract $T_c$, a blocking plate 306 for blocking only 0th-order diffracted light beam $LL_0$ out of diffracted light beams $LL_0, LL\pm_1, \ldots, LL\pm_n$ from the focusing lens 305, and a light spot position detecting element 307 such as an image sensor for detecting positions of light spots $LP\pm_1$ of positive and negative diffracted light beams of the same order (the first-order diffracted lights $LM\pm_1$ in the figure) which have passed through the blocking plate 306 and for converting the positions of light spots into electric signals. The luminous element 301, the collimating lens 302, the slit 303, the focusing lens 305 and the blocking plate 306 are fixed in a linear arrangement and may be moved relatively to the scale 304. As shown in the figure, however, the scale 304 is adapted to move linearly in the longitudinal direction E or F.

As shown in FIGS. 20A–20K, the scale 304 used in the optical system 300 of the absolute type optical encoder of the above structure is provided with the grating track $T_c$ having transmission sections and non-transmission sections of the same aperture ratio and pitch but disposed in different directions along a distance $l_{AB}$ (more particularly, since the location of the detection moves from k→l→m→n in accordance with the movement of the grating track $T_c$, the direction of grating line rotates counterclockwise and returns at a o to the same direction as the point k). The light spots $LP_{+1}$ and $LP_{-1}$ of incident first-order diffracted light beams $LM_{+1}$ on the detector 307 rotate constantly (in FIG. 20, k'→l'→m'→n'→o') on the circumference of the diameter $d_1$ on the detector 307 at an interval angle 180° since the scale 304 moves in the longitudinal direction E or F. By using the rotation angle, the position on the scale 304 can be detected.

As stated above, since the direction of grating line is used simply to rotate light spots, it is possible to change the direction of grating line along the distance $l_{AB}$ freely. The position on the scale can thus be detected using such a rotational angle of the light spots of any positive and negative diffracted light beams of the same order.

Figure 21:
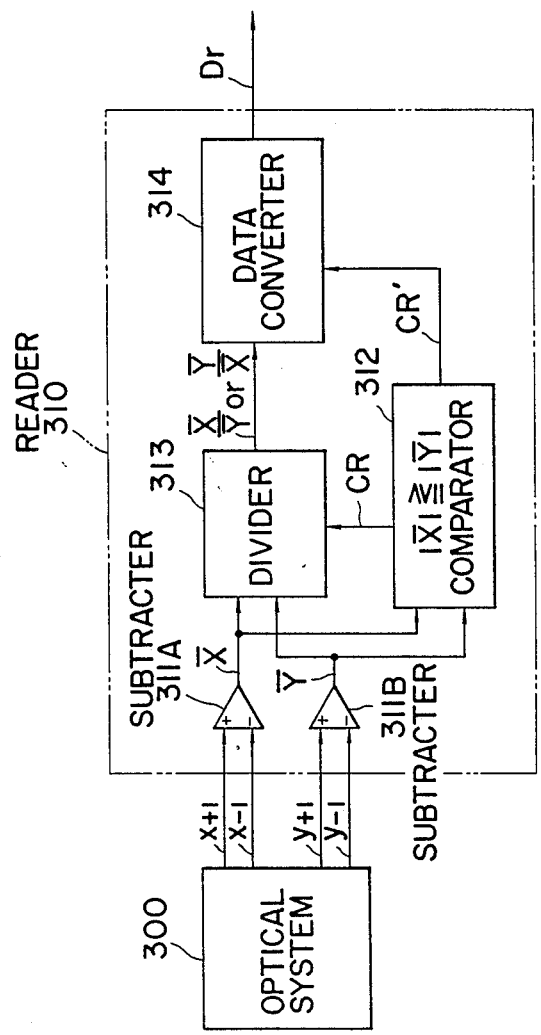
FIG. 21 is a block diagram showing an embodiment of a detection circuit thereof.

FIG. 21 is a block diagram showing embodiment of a reader which obtains positional data from the electric signals of the light spot position detecting element 307. As mentioned above, positive and negative diffracted light beams of the same order are arbitrarily selected, for instance, positions of the two light spots $LP_{+1}$, $LP_{-1}$ of the first-order diffracted light beams $LM\pm_1$ are converted by the light spot detecting element 307 into electric signals $(X_{+1}, Y_{+1})$ and $(X_{-1}, Y_{-1})$ which express coordinates (X, Y) as shown in FIG. 22. Subtracters 311A and 311B obtain the X component $\overline{X}=(X_{+1}-X_{-1})$ and the Y component $\overline{Y}=(Y_{+1}-Y_{-1})$ between light spots to output the results to a comparator 312 and a divider 313. The comparator 312 compares the X component $\overline{X}$ and the Y component $\overline{Y}$ ($|\overline{X}| \geq |\overline{Y}|$ or $|\overline{X}| < |\overline{Y}|$), and outputs the result to the divider 313. when $|\overline{X}| \geq |\overline{Y}|$, the divider 313 calculates $\overline{Y}/\overline{X}$ and when $|\overline{X}| < |\overline{Y}|$, it calculates $\overline{X}/\overline{Y}$, and outputs the results to a data converter 311. FIGS. 23A–23F show examples of the relationship between the dividend $\overline{Y}/\overline{X}$ or $\overline{X}/\overline{Y}$ and the position on the scale 304, the positions of the light spots on the detector 307 corresponding to the above, and the comparison result CR of the comparator 312. In this case, the scale 304 is provided with the grating track $T_c$ wherein the position of the scale 304 is proportionate to the changes of grating line direction. As the scale 304 changes its position, the dividend $\overline{Y}/\overline{X}$ within the scope of $|\overline{X}| \geq |\overline{y}|$ defines a tangent curve while the dividend $\overline{X}/\overline{Y}$ within the scope of $|\overline{X}| < |\overline{Y}|$ defines a cotangent curve. The data converter 314 calculates $\tan^{-1}(\overline{Y}/\overline{X})$ when the result CR' from the comparator 312 is $|\overline{X}| \leq |\overline{Y}|$, and $\cot^{-1}(\overline{X}/\overline{Y})$ when it is $|\overline{X}| < |\overline{Y}|$ in order to obtain gradient of of the linear line connecting the spots $LP_{+1}$ and $LP_{-1}$, and outputs an appropriate positional data $D_P$ out of the data on the positions of the scale 304 which are stored in advance. Even if the scale 304 is provided with the grating track Tc where the position of the scale 304 is not proportional to the changes in grating line direction, the positional data $D_P$ can be obtained simply by storing in advance the positional data of the scale 304 which corresponds to the dividend or $\overline{Y}/\overline{X}$ or $\overline{X}/\overline{Y}$ in the converter 314.

Although in the aforementioned third embodiment, the coherent light emitted from the luminous element is transmitted into the scale to obtain the diffracted light beams, it may instead be reflected from the scale to obtain the diffracted light beams since transmitted light and reflected light have the same properties. When the light is reflected, the luminous element, the collimating lens, the slit, the focusing lens, blocking plate and the light spot position detecting element are arranged on the same side as the scale, and the scale comprises sections which reflect light and sections which do not reflect light. If the scale is made into a disc 308 as shown in FIG. 24, and the grating track Tc is arranged annularly on the surface thereof, the disc 308 may be rotated around the center thereof, and the angles can be detected in an absolute fashion. Although in the aforementioned embodiment, the light source and the light spot position detecting element are fixed while the scale is moved for positional detection, the scale may instead be fixed while the light source and the light spot position detecting element are moved to achieve a similar effect in positional detection.

As described in detail in the foregoing, this invention optical encoder enables detection of absolute position over a long stroke simply with only one grating track instead of plural grating tracks of conventional encoders. This greatly contributes to minimize the size of an optical encoder and of its components as well as to reduce the manufacturing and production cost of optical encoders.

Especially in the case of the first embodiment, the number of photo detectors can be reduced from the plurality of the prior art to only two to thereby drastically decrease the number of components and to further reduce the manufacturing and production costs.

It should be understood that many modifications and adaptations of the invention will become apparent to those skilled in the art and the invention is intended to encompass such obvious modifications and changes in the scope of the claims appended hereto.

What is claimed is:

1. An optical encoder comprising:

light source means for emitting coherent parallel light;

a scale having a grating track for diffracting parallel light emitted from said light source means, said grating track having a plurality of linear adjacent gratings extending in a lengthwise direction, each of said plurality of linear adjacent gratings extending in a widthwise direction to define a pitch, and each having a non-transmitting section and an adjacent transmitting section extending in said lengthwise direction;

wherein an aperture ratio defined by a ratio between a width of said transmitting portion and said pitch is substantially constant for each of said plurality of linear adjacent gratings of said grating track;

wherein said pitch of each of said plurality of linear adjacent gratings of said grating track varies along said grating track;

light spot position detecting means for receiving positive and negative diffracted light beams of a same order from the parallel light diffracted by said grating track, and for detecting light spot positions of said positive and negative diffracted light beams of the same order, and for converting the thus detected light spot positions into representative electrical signals.

2. The optical encoder as claimed in claim 1, wherein said light source means comprises a light source which emits coherent light, a collimating lens which collimates into parallel light said coherent light emitted from said light source, and a slit which restricts said parallel light collimated by said collimating lens into a predetermined width.

3. The optical encoder as claimed in claim 2, wherein said light source is an element to oscillate a laser beam.

4. The optical encoder as claimed in claim 1, wherein said light source means and said light spot position detecting means are arranged on opposite sides of said scale, and the transmitting section of each of said plurality of linear adjacent gratings allows said parallel light emitted from said light source means to pass therethrough.

5. The optical encoder as claimed in claim 1, wherein said light source means and said light spot position detecting means are arranged on a same side of said scale, and the transmitting section of each of said plurality of linear adjacent gratings reflects said parallel light emitted from said light source means.

6. The optical encoder as claimed in claim 1, wherein a relative movement of said scale relative said light source means and said light spot position detecting means is enabled by a movement of said scale.

7. The optical encoder as claimed in claim 1, wherein a relative movement of said scale relative said light source means and said light spot position detecting means is enabled by a movement of said light spot position detecting means and said light source means.

8. The optical encoder as claimed in claim 1, wherein said scale is an elongated plate provided with an elongated grating track, and said relative movement is linear.

9. The optical encoder as claimed in claim 1, wherein said scale is a disc provided with an annular grating track, and said relative movement is revolutionary.

10. The optical encoder as claimed in claim 1, wherein said light spot position detecting means comprises a focusing lens which focuses light beams diffracted by said grating track, and a light spot position detecting element which detects light spot positions of light beams focused by said focusing lens and converts said light spot positions into electric signals.

11. The optical encoder as claimed in claim 10, wherein said light spot position detecting element is an image sensor which converts light spot positions into electric signals.

12. An optical encoder comprising:
light source means for emitting coherent parallel light;

a scale having a grating track for diffracting parallel light emitted from said light source means, said grating track having a plurality of linear adjacent gratings extending in a lengthwise, each of said plurality of linear adjacent gratings extending in a widthwise direction to define a pitch, and each having a non-transmitting section and an adjacent transmitting section extending in said lengthwise direction;

wherein an aperture ration defined by a ratio between a width of said transmitting portion and said pitch is substantially constant for each of said plurality of linear adjacent gratings of said grating track;

wherein said pitch of each of said plurality of linear adjacent gratings of said grating track varies along said grating track;

light spot position detecting means for receiving positive and negative diffracted light beams of a same order from the parallel light diffracted by said grating track, and for detecting light spot positions of said positive and negative diffracted light beams of the same order, and for converting the thus detected light spot positions into representative electrical signals;

reading and converting means for calculating a distance between said positive and negative diffracted light beams of the same order from the electric signals outputted from said light spot position detecting means, said distance changing according to a relative movement of said scale relative said light source means and said light spot position detecting means, and for converting said distance into a positional data representing a position on said scale.

13. The optical encoder as claimed in claim 12, wherein said reading and converting means comprises a subtracter which calculates a difference between electric signals expressing positions of said positive and negative diffracted light beams of the same order which are outputted from said light spot position detecting means, and outputs in the form of an electric signal expressing said distance, and a holder which holds said electric signal from said subtracter, and an A/D converter which converts said electric signal from said holder from an analogue signal into a digital signal, and a means for converting an output from said A/D converter into the positional data.

14. The optical encoder as claimed in claim 13, wherein said means for converting comprises a memory which stores in advance distances between said positive and said negative diffracted light beams of a same order in correspondence with patterns of said grating track which vary along with the relative movement of said scale relative said light source means and said light spot detecting means, and a collator which compares said distance obtained by said A/D converter with the distance stored in said memory, and outputs accordingly the positional data.

15. The optical encoder as claimed in claim 13, wherein said means for converting comprises an operating section which inputs the distance obtained by said A/D converters, calculates a preset formula in order to convert said distance into the positional data, and outputs the positional data.

* * * * *